United States Patent [19]

Whatley

[11] 4,336,503
[45] Jun. 22, 1982

[54] DRIVER CIRCUIT HAVING REDUCED CROSS-OVER DISTORTION

[75] Inventor: Roger A. Whatley, Austin, Tex.

[73] Assignee: Motorola, Inc., Schaumburg, Ill.

[21] Appl. No.: 217,073

[22] Filed: Dec. 16, 1980

[51] Int. Cl.³ .......................... H03F 3/30; H03F 3/45
[52] U.S. Cl. .................................. 330/253; 330/255; 330/264; 330/268; 330/300
[58] Field of Search ............... 330/253, 255, 264, 268, 330/269, 274, 300

[56] References Cited

U.S. PATENT DOCUMENTS 4,068,187  1/1978  Amada et al. ..................... 330/268

OTHER PUBLICATIONS

Haque et al., "A Two Chip PCM Voice CODEC with Filters", *IEEE Journal of Solid-State Circuits*, vol. SC-14, No. 6, Dec. 1979, pp. 961–969.

*Primary Examiner*—James B. Mullins
*Attorney, Agent, or Firm*—Anthony J. Sarli, Jr.; Jeffrey Van Myers; Robert L. King

[57] ABSTRACT

A driver circuit suitable for use in an operational amplifier, includes a bipolar pull-up transistor which sources current to an output terminal in proportion to an applied drive current, and an MOS pull-down transistor which sinks current from the output terminal in proportion to an applied control voltage. An MOS drive transistor provides a constant drive current for the pull-up transistor, and an MOS shunt transistor shunts the drive current away from the bipolar transistor in proportion to the control voltage. A cross-over compensation circuit develops a predetermined bias voltage on the base of the bipolar transistor relative to the voltage on the output terminal, to assure a minimum level of operation of the bipolar transistor when the output terminal is near the analog ground voltage.

6 Claims, 1 Drawing Figure

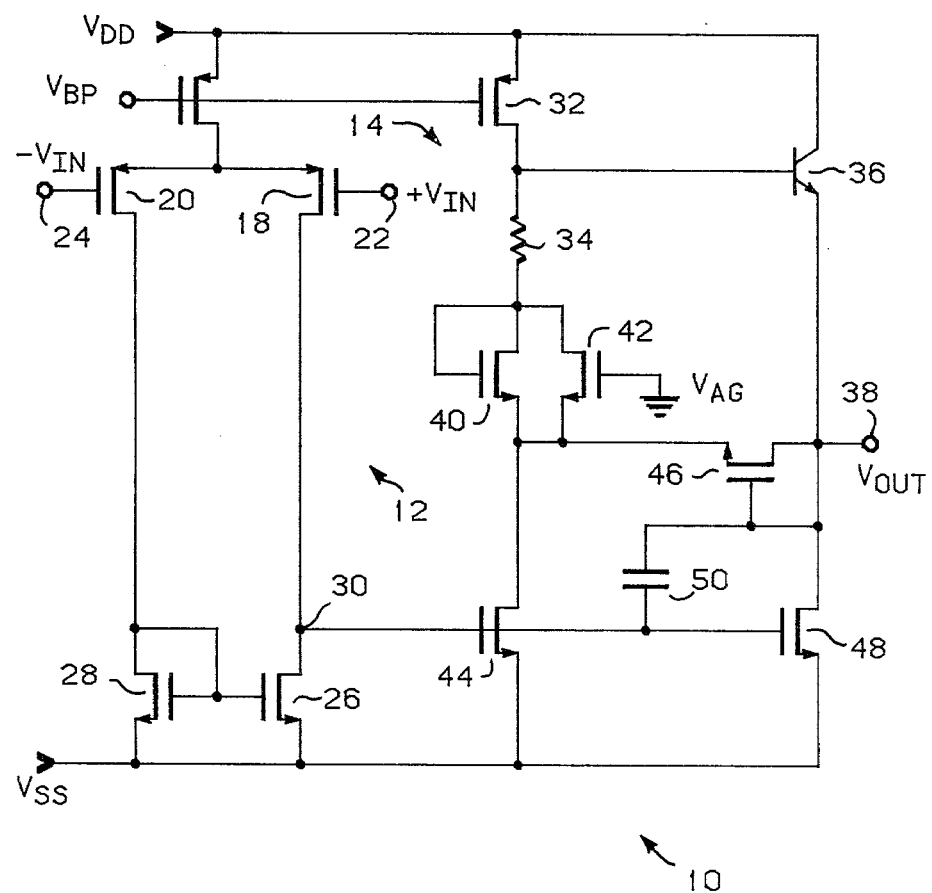

DRIVER CIRCUIT HAVING REDUCED CROSS-OVER DISTORTION

TECHNICAL FIELD

This invention relates generally to driver circuits and, more particularly, to a driver circuit having reduced cross-over distortion when used with an operational amplifier.

BACKGROUND ART

Various forms of operational amplifiers have been designed for fabrication using conventional complementary MOS fabrication processes. For example, typical high and low output impedance operational amplifiers are shown and described in "A Two Chip PCM Voice CODEC with Filters" by Haque, Gregorian, Blasco, Mao and Nicholson, Jr. in the IEEE *Journal of Solid-State Circuits,* Volume SC-14, No. 6, December, 1979, pages 961–969. In general, such operational amplifiers provide an output signal which varies between a positive supply $V_{DD}$ and a negative supply $V_{SS}$ relative to an intermediate analog ground $V_{AG}$ in proportion to the difference in the voltage of two input signals. Many operational amplifiers have been designed for operation as Class A amplifiers. However, even when fabricated in CMOS, the high power dissipation of such circuits generally prohibits their use as output driver amplifiers in LSI circuits. To reduce power dissipation, operational amplifiers may be designed for Class B operation where both output devices are simultaneously off when the output signal is very near the analog ground. As a result, such operational amplifiers exhibit severe cross-over distortion, i.e. distortions in the output signal in the region of the analog ground. To simultaneously reduce power dissipation relative to the Class A case while minimizing the cross-over distortion, operational amplifiers may be designed for Class AB operation where both output devices are simultaneously on when the output signal is near the analog ground. Such circuits must be carefully designed to restrict the simultaneous operation of the output devices to the situation where the output signal is within a minimum threshold above or below the analog ground $V_{AG}$. If not, the resulting reduction in cross-over distortion may be at the expense of excessive amounts of quiescent DC current.

SUMMARY OF THE INVENTION

It is an object of the present invention to provide a CMOS operational amplifier having low power dissipation and high open loop gain.

Another object of the present invention is to provide a CMOS operational amplifier having reduced cross-over distortion.

These and other objects of the invention are achieved in an operational amplifier having a current source for sourcing output current via an output terminal in proportion to an applied drive current, and a current sink for sinking output current via the output terminal in proportion to a first input voltage. A drive device applies drive current to the current source in proportion to a second input voltage, while a shunt device shunts the drive current away from the current source in proportion to the first input voltage. Cross-over compensation is provided by a biasing circuit which maintains the voltage applied to the current source by the drive device at least a predetermined bias voltage above the voltage at the output terminal. A bias adjusting circuit adjusts the bias to prevent the biasing circuit from turning the current source on when the voltage on the output terminal is more than a predetermined threshold below the analog ground $V_{AG}$.

BRIEF DESCRIPTION OF THE DRAWING

The FIGURE illustrates in schematic form an operational amplifier constructed in accordance with a preferred embodiment of the present invention.

DESCRIPTION OF THE PREFERRED EMBODIMENT

Shown in the drawing is an operational amplifier 10 constructed in accordance with the preferred embodiment of the present invention. The operational amplifier 10 is comprised generally of a differential input portion 12 and an output driver portion 14. In the differential input portion 12, a P-channel MOS transistor 16 has the source thereof connected to a positive supply $V_{DD}$, and the gate thereof connected to a bias current reference voltage $V_{BP}$. The drain of the transistor 16 is connected to the sources of a pair of P-channel MOS transistors 18 and 20. The gate of the transistor 18 is connected to a positive input terminal 22, labeled $+V_{IN}$, and the gate of the transistor 20 is connected to a negative input terminal 24, labeled $-V_{IN}$. The drains of the transistors 18 and 20 are connected to the drains of a pair of N-channel MOS transistors 26 and 28, respectively. The gates of the transistors 26 and 28 are each connected to the drain of the transistor 20, and the sources thereof connected to a negative supply $V_{SS}$.

In operation, the transistor 16 provides a constant bias current proportional to the bias current reference voltage applied to the gate thereof. The bias current is divided between the differentially-connected transistors 18 and 20, depending upon the difference in the voltages applied to the gates thereof. That proportion of the bias current which is applied by the transistor 20 to the diode-connected transistor 28 determines the gate to source voltage $V_{GS}$ thereof. Since the transistor 26 has the same gate to source voltage $V_{GS}$ as the transistor 28, the transistor 26 will try to conduct the same current as the transistor 28. If the input voltages on the gates of the transistors 18 and 20 are the same so that the transistor 18 is conducting the same proportion of the bias current as the transistor 20, then the current through the transistors 26 and 28 will be the same. Thus, the voltage on the drain of the transistor 26 will be the same as the voltage on the drain of the transistor 28 relative to the negative supply $V_{SS}$.

If the input voltages are different so that transistor 18 is not conducting as much of the bias current as the transistor 20, then the voltage on the drain of the transistor 26 will vary relative to the voltage on the drain of the transistor 28. For example, if the input voltages shift such that the voltage at the negative input terminal 24 is less than the voltage on the positive input terminal 22, then the transistor 20 will conduct a greater amount of the bias current to the transistor 28 than the transistor 18 does to the transistor 26. The transistor 26 will therefore be conducting more current than the transistor 18, and the voltage on the drain thereof will decrease relative to the negative supply $V_{SS}$. On the other hand, if the input voltages shift such that the voltage applied to the negative input terminal 24 is greater than the voltage applied to the positive input terminal 22, then the transistor 20 will conduct a smaller amount of the bias current to the transistor 28 than the transistor 18 conducts to the transistor 26. The transistor 26 will therefore be conducting less current than the transistor 18, and the voltage on the drain thereof will increase relative to the negative supply $V_{SS}$. Because of the high output impedances of the transistors 18 and 26, relatively small changes in the currents provided by the transistors 18 and 20 in response to small differences in the voltage applied to the input terminals 22 and 24 produce relatively large changes in the differential voltage on the drain of the transistor 26 relative to the negative supply $V_{SS}$. For convenience of reference, the differential voltage will be referenced relative to a node 30, rather than to the drain of the transistor 26 itself.

In the output driver portion 14, a P-channel MOS transistor 32 has the source thereof connected to the positive supply $V_{DD}$, and the gate thereof connected to the bias current reference voltage $V_{BP}$. The drain of the transistor 32 is connected to a resistor 34, and to the base of an NPN bipolar transistor 36. The transistor 36 has the collector thereof connected to the positive supply $V_{DD}$, and the emitter thereof connected to an output terminal 38, labeled $V_{OUT}$. The other end of the resistor 34 is connected to the gate and drain of an N-channel MOS transistor 40, and to the drain of an N-channel MOS transistor 42. The gate of the transistor 42 is connected to an analog ground $V_{AG}$, while the sources of each of the transistors 40 and 42 are connected to the drain of an N-channel MOS transistor 44. The gate of the transistor 44 is connected to the node 30, and the source thereof is connected to the negative supply $V_{SS}$. The sources of the transistors 40 and 42 are also connected to the source of an N-channel transistor 46 which has the gate and drain thereof connected to the output terminal 38. An N-channel MOS transistor 48 has the drain thereof connected to the output terminal 38, the source thereof connected to the negative supply $V_{SS}$, and the gate thereof connected to the node 30. A capacitor 50 is connected between the output terminal 38 and the drain of the transistor 26.

In this configuration, the transistor 48 acts as a voltage controlled current sink by sinking output current from a load (not shown) connected to the output terminal 38, in proportion to the differential voltage developed on the node 30. In contrast, the transistor 36 acts as a current-controlled current source by sourcing output current to the load (not shown) connected to the output terminal 38, in proportion to the drive current applied to the base thereof. The transistor 32, in turn, applies drive current to the base of the transistor 36 in proportion to the bias current reference voltage $V_{BP}$. Simultaneously, however, the transistor 44 will be shunting the drive current away from the transistor 36 in proportion to the differential voltage developed on the node 30. Thus, under most conditions, the differential voltage controls the operation of both of the transistors 36 and 48 in substantially the same manner as in prior art circuits.

The illustrated embodiment differs from such prior art circuits in that the transistors 36 and 48 are biased so that both will be simultaneously conducting a selected minimal amount of current when the output terminal is very near $V_{AG}$. This situation would occur, for example, when the operational amplifier 10 is connected in a conventional voltage follower configuration, that is with the negative input terminal 24 connected to the output terminal 38, and the positive input terminal 22 is at $V_{AG}$. Under these conditions, the differential amplifier portion 12 will develop a differential voltage on the node 30 proportional to the difference between the voltage on the output terminal 38 and $V_{AG}$. Assuming that the output voltage is initially substantially above $V_{AG}$, then the differential voltage developed on the node 30 will be high relative to the negative supply $V_{SS}$. In response to such a high gate voltage, the transistor 44 will turn on hard, pulling the voltage on the drain thereof toward $V_{SS}$. By constructing the transistor 32 to provide less drive current than the transistor 44 is capable of conducting under such a gate voltage, the voltage on the drain of the transistor 44 will drop until the diode-connected transistor 46 becomes forward biased. At this point, the transistor 44 will sink from the output terminal 38 whatever level of current is necessary to maintain the voltage on the drain thereof one $V_{GS}$ below the instantaneous voltage on the output terminal 38. Meanwhile, the transistor 48 has also turned on hard and will be sinking output current from the output terminal 38. The combined effect of the transistors 44 and 48 is to rapidly pull the voltage on the output terminal 38 toward $V_{AG}$.

As the voltage on the output terminal 38 approaches $V_{AG}$, the differential voltage on the node 30 will drop, reducing the current through the transistors 44 and 48. Once the current shunted by the transistor 44 drops to the level of drive current provided by the transistor 32, the voltage on the drain of the transistor 44 will rise above the voltage necessary to forward bias the transistor 46, i.e. less than one $V_{GS}$ below the voltage on the output terminal 38. By constructing the resistor 34 and the transistor 40 so that the sum of the voltage drop across the resistor 34 and the $V_{GS}$ of the transistor 40 is approximately equal to the sum of the $V_{BE}$ of the transistor 36 and the $V_{GS}$ of the transistor 46, then the voltage on the base of the transistor 36 will be very close to the voltage necessary to turn the transistor 36 on.

As the transistor 48 continues to sink current from the output terminal 38, the voltage on the output terminal 38 will continue to converge toward $V_{AG}$. The resultant drop in the differential voltage further reduces the current shunted through the transistor 44 below the level of drive current being provided by the transistor 32. This excess current raises the voltage on the drain on the transistor 44, and thus the voltage on the base of the transistor 36. As soon as the voltage is one $V_{BE}$ above the instantaneous voltage on the output terminal 38, the base-emitter junction of the transistor 36 forward biases, turning on the transistor 36. The transistor 36, being a high current gain, low impedance device, will thereafter source whatever level of output current is necessary to maintain the output terminal 38 at $V_{AG}$, without appreciably changing the voltage developed on the base thereof.

Assuming, on the other hand, that the output voltage is initially well below $V_{AG}$, then the differential voltage developed on the node 30 will be relatively close to the negative supply $V_{SS}$. In response to such a low gate voltage, the transistors 44 and 48 will substantially turn off. The drive current provided by the transistor 32 rapidly raises the voltage on the drain of the transistor 32, and thus the voltage on the base of the transistor 36. As soon as the voltage is one $V_{BE}$ above the instantaneous voltage on the output terminal 38, the base-emitter junction of the transistor 36 forward biases, turning on the transistor 36. Since all of the drive current is available as base drive, the transistor 36 turns on hard, and sources a large output current to rapidly pull the voltage on the output terminal 38 toward $V_{AG}$.

As the voltage on the output terminal 38 approaches $V_{AG}$, the differential voltage on the node 30 will rise. When the differential voltage reaches the $V_T$ of the transistor 44, the transistor 44 will turn on, pulling the voltage on the drain thereof toward $V_{SS}$. When the voltage is sufficiently low to forward bias the diode-connected transistor 40, the transistor 44 will begin shunting some of the drive current away from the transistor 36, reducing the output current provided by the transistor 36. Meanwhile, the transistor 48 has also turned on and will be sinking increasing levels of output current from the output terminal 38. With the current through the transistor 36 decreasing and the current through the transistor 48 increasing, the voltage on the output terminal 38 will converge toward $V_{AG}$ until the differential voltage is just sufficient to bias the transistors 36 and 48 at the current levels necessary to maintain the output terminal 38 at $V_{AG}$.

Even though the operational amplifier 10 may be constructed to have a very large overall loop gain, it will be less than the infinity gain of an ideal operational amplifier, and a loop gain error inversely proportional to the loop gain will exist between the voltage on the output terminal 38 and the voltage applied to the positive input terminal 22. Assuming that the operational amplifier 10 in the voltage follower example given above has a loop gain of 1000, then a +1 volt signal applied to the positive input terminal 22 would produce an output voltage of +0.999 volts on the output terminal 38 for a loop gain error of only 1 millivolt.

When the operational amplifier 10 is connected as a voltage follower and an input voltage very close to the negative supply $V_{SS}$ is applied to the positive input terminal 22, the differential voltage on the node 30 will be high, so that the transistors 44 and 48 will both be on. In general, however, the voltage on the drain of the transistor 44 will reach $V_{SS}$ before the output terminal 38. At this point, the voltage on the base of the transistor 36 will be above $V_{SS}$ by the $V_{GS}$ of the transistor 40 and the IR drop across the resistor 34. As the voltage on the output terminal 38 continues to drop, the voltage across the base-emitter junction of the transistor 36 increases until the transistor 36 turns on. The resulting increase in power dissipation, while not destructive, may be undesirable.

To avoid this situation, the operational amplifier 10 is constructed to reduce the bias on the base of the transistor 36 when the output voltage is below $V_{AG}$ by a selected threshold. In particular, the transistor 42 will short out the transistor 40 when the latter transistor is no longer needed to perform the cross-over compensation function. With $V_{AG}$ on the gate thereof, the transistor 42 will turn on as soon as the voltage on the drain of the transistor 44 drops below $V_{AG}$ by the $V_T$ of the transistor 42. Since the $V_{ON}$ of the transistor 42 is less than the $V_{GS}$ of the transistor 40, the total voltage differential between the drain of the transistor 44 and the base of the transistor 36 is now less than the $V_{BE}$ of the transistor 36. Therefore, even if the voltage on the output terminal 38 should reach $V_{SS}$, the bias on the base of the transistor 36 will still be insufficient to turn on the transistor 36. However, to prevent oscillation during the period when the transistor 42 is operating in the linear region, the size of the transistor 42 must be carefully selected to keep the voltage gain around the loop comprised of the resistor 34, transistor 36, transistor 46 and transistor 42 below one.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A driver circuit comprising:
   current source means for sourcing output current via an output terminal in proportion to an applied drive current;
   current sink means for sinking output current via the output terminal in proportion to a first control voltage;
   drive means for applying the drive current to the current source means in proportion to a second control voltage;
   shunt means for shunting the drive current away from the current source means in proportion to the first control voltage; and
   cross-over compensation means for biasing the current source means at least a predetermined bias voltage above the output terminal, comprising:
   a resistor having a portion coupled to both the current source means and the drive means;
   a first diode-connected device coupled between said resistor and said shunt means; and
   a second diode-connected device coupled between said first diode-connected device and both the output terminal and the current sink means.

2. The driver circuit of claim 1 wherein the cross-over compensation means includes bias adjusting means for adjusting the bias voltage from a first predetermined level to a second predetermined level less than the first level when the voltage on the output terminal is below a selected threshold voltage.

3. An operational amplifier comprising the driver circuit of claim 1 or 2, and a differential amplifier circuit for developing the first control voltage in proportion to the voltage differential between first and second input voltages.

4. In a driver circuit comprising:
   an NPN bipolar transistor having the collector thereof coupled to a positive supply, and the emitter thereof coupled to an output terminal;
   a first N-channel MOS transistor having the source thereof coupled to a negative supply, the drain thereof coupled to the output terminal, and the gate thereof coupled to a first control voltage;
   a P-channel MOS transistor having the source thereof coupled to the positive supply, the drain thereof coupled to the base of the bipolar transistor, and the gate thereof coupled to a second control voltage; and
   a second N-channel MOS transistor having the source thereof coupled to the negative supply, and the gate thereof coupled to the first control voltage;
   a cross-over compensation circuit comprising:
   a third N-channel MOS transistor having the source thereof coupled to the drain of the second MOS transistor;

a resistor coupled between the base of the bipolar transistor and the drain and gate of the third MOS transistor; and a fourth N-channel MOS transistor having the source thereof coupled to the drain of the second MOS transistor, and the drain and gate thereof coupled to the output terminal.

5. In the driver circuit of claim 4, the cross-over compensation circuit further comprising:

a fifth N-channel MOS transistor having the source thereof coupled to the drain of the second MOS transistor, the drain thereof coupled to the drain and gate of the third MOS transistor, and the gate thereof coupled to a selected threshold voltage.

6. An operational amplifier comprising the driver circuit of claim 4 or 5, and a differential amplifier circuit for developing the first control voltage in proportion to the voltage differential between first and second input voltages.

* * * * *